(12) United States Patent
Desmet et al.

(10) Patent No.: US 10,569,528 B2
(45) Date of Patent: Feb. 25, 2020

(54) METHOD FOR PREPARING A LITHOGRAPHIC PRINTING PLATE PRECURSOR

(71) Applicant: AGFA GRAPHICS NV, Mortsel (BE)

(72) Inventors: Tim Desmet, Mortsel (BE); Johan Loccufier, Mortsel (BE)

(73) Assignee: AGFA NV, Mortsel (BE)

( * ) Notice: Subject to any disclaimer, the term of this patent is extended or adjusted under 35 U.S.C. 154(b) by 194 days.

(21) Appl. No.: 15/524,821

(22) PCT Filed: Nov. 2, 2015

(86) PCT No.: PCT/EP2015/075389
§ 371 (c)(1),
(2) Date: May 5, 2017

(87) PCT Pub. No.: WO2016/071255
PCT Pub. Date: May 12, 2016

(65) Prior Publication Data
US 2017/0313052 A1    Nov. 2, 2017

(30) Foreign Application Priority Data

Nov. 6, 2014 (EP) .................................... 14192061

(51) Int. Cl.
| | |
|---|---|
| *B41C 1/10* | (2006.01) |
| *G03F 7/16* | (2006.01) |
| *C09D 11/40* | (2014.01) |
| *C09D 11/101* | (2014.01) |
| *C09D 11/107* | (2014.01) |

(52) U.S. Cl.
CPC .......... *B41C 1/1066* (2013.01); *C09D 11/101* (2013.01); *C09D 11/107* (2013.01); *C09D 11/40* (2013.01); *G03F 7/168* (2013.01)

(58) Field of Classification Search
None
See application file for complete search history.

(56) References Cited

U.S. PATENT DOCUMENTS

2006/0188813 A1* 8/2006 Shimada ............... B41C 1/1066
430/270.1

FOREIGN PATENT DOCUMENTS

| | | |
|---|---|---|
| CN | 103358639 A * | 10/2013 |
| EP | 1 266 750 A1 | 12/2002 |
| EP | 1 342 568 A1 | 9/2003 |
| EP | 1 800 890 A1 | 6/2007 |
| EP | 1 935 652 A1 | 6/2008 |
| EP | 2 033 778 A1 | 3/2009 |

(Continued)

OTHER PUBLICATIONS

Official Communication issued in International Patent Application No. PCT/EP2015/075389, dated Jan. 14, 2016.

*Primary Examiner* — Joshua D Zimmerman
(74) *Attorney, Agent, or Firm* — Keating and Bennett, LLP

(57) ABSTRACT

A method according for preparing a lithographic printing plate containing a lithographic image consisting of printing areas and non-printing areas includes the steps of jetting and curing droplets of a first curable fluid on a hydrophilic support thereby forming a printing area of the lithographic image; and jetting and curing droplets of a second curable fluid in a non-printing area of the lithographic image thereby forming a hydrophilic protective layer on the hydrophilic support.

13 Claims, 1 Drawing Sheet

(56) References Cited

FOREIGN PATENT DOCUMENTS

JP          2007185903 A  *  7/2007
WO       2005/111727 A1    11/2005

* cited by examiner

METHOD FOR PREPARING A LITHOGRAPHIC PRINTING PLATE PRECURSOR

CROSS REFERENCE TO RELATED APPLICATIONS

This application is a 371 National Stage Application of PCT/EP2015/075389, filed Nov. 2, 2015. This application claims the benefit of European Application No. 14192061.1, filed Nov. 6, 2014, which is incorporated by reference herein in its entirety.

BACKGROUND OF THE INVENTION

1. Field of the Invention

The present invention relates to a method of preparing a lithographic printing plate. More in particular, the invention relates to a truly processless method of preparing a lithographic printing plate by inkjet.

2. Description of the Related Art

Lithographic printing typically involves the use of a lithographic printing plate which is mounted on a cylinder of a rotary printing press. The plate carries a lithographic image on its surface and a print is obtained by applying ink to said image and then transferring the ink from the master onto a receiver material, which is typically paper. In conventional lithographic printing, ink as well as an aqueous fountain solution (also called dampening liquid) are supplied to the lithographic image which consists of oleophilic (or hydrophobic, i.e. ink-accepting, water-repelling) areas as well as hydrophilic (or oleophobic, i.e. water-accepting, ink-repelling) areas. In so-called driographic printing, the lithographic image consists of ink-accepting and ink-adhesive (ink-repelling) areas and during driographic printing, only ink is supplied to the master.

Lithographic printing plates are typically obtained by image-wise exposure and processing of an imaging material called plate precursor. The coating of the precursor is exposed image-wise to heat or light, typically by means of a digitally modulated exposure device such as a laser, which triggers a (physico-)chemical process, such as ablation, polymerization, insolubilization by cross-linking of a polymer or by particle coagulation of a thermoplastic polymer latex, solubilization by the destruction of intermolecular interactions or by increasing the penetrability of a development barrier layer. Although some plate precursors are capable of producing a lithographic image immediately after exposure, the most popular plate precursors require wet processing since the exposure produces a difference of solubility or of rate of dissolution in a developer between the exposed and the non-exposed areas of the coating. In positive working plates, the exposed areas of the coating dissolve in the developer while the non-exposed areas remain resistant to the developer. In negative working plates, the non-exposed areas of the coating dissolve in the developer while the exposed areas remain resistant to the developer. Most plates contain a hydrophobic coating on a hydrophilic support, so that the areas which remain resistant to the developer define the ink-accepting, printing areas of the plate while the hydrophilic support is revealed by the dissolution of the coating in the developer at the non-printing areas.

To obtain a lithographic printing plate, in addition to the exposure step, a plurality of additional steps are often necessary such as for example a preheat step, a developing step, a baking step, a gumming step, a drying step, etc.

Each additional step is time and energy consuming and may involve extra apparatuses, such as a processor, a gumming unit, or a baking oven or a developing machine, and chemicals.

A simplification of the platemaking process realized in EP-A 1342568 and WO2005/111727 involves the combination of the development step and the gumming step into a single step. In the so-called on-press processing approach, a separate development step is no longer necessary as development is carried out on-press by supplying ink and fountain. A concern with on press processing is press contamination and/or an elaborate start-up procedure of the press.

In an inkjet computer-to-plate method the printing areas are applied on a lithographic support by means of inkjet printing. An additional gumming step is often necessary to protect the non-printing areas of the plate while storing the plate before printing. In EP-A 1800890 a method is disclosed wherein a gum solution is applied by inkjet to provide a hydrophilic protecting layer on a printing plate. A drying step however remains necessary to obtain a dried hydrophilic protecting layer.

To realize high press runs a baking step is often necessary. Also the trend towards higher printing speeds on web presses and the use of recycled paper often necessitate such a baking step. The elimination of such a baking leads to reduced energy consumption and less floor space.

SUMMARY OF THE INVENTION

It is an object of the present invention to provide a truly processless method of preparing a lithographic printing plate.

Other objects of the invention are realized by the methods described below.

Preferred embodiments of the present invention provide a truly processless method of preparing a lithographic printing plate wherein no baking step is necessary to obtain a high press run capability.

Further advantages and preferred embodiments of the present invention will become apparent from the following description.

DETAILED DESCRIPTION OF THE PREFERRED EMBODIMENTS

Definitions

Figure 1:
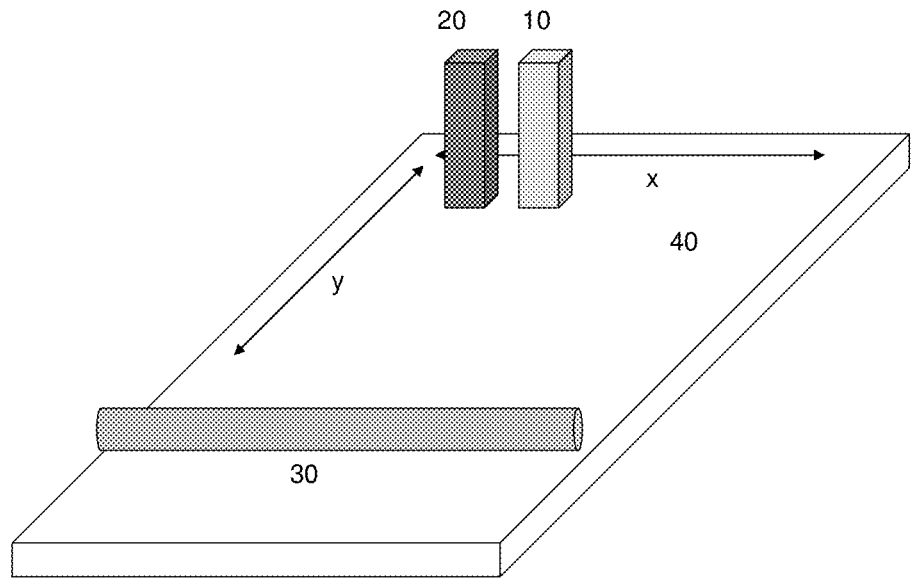
FIG. 1 shows a preferred embodiment of a flat bed printing device which is used in a method of preparing a lithographic printing plate according to the present invention.

A truly processless method of preparing a lithographic printing plate as used herein means that no hydrophobic material has to be removed, either in a separate wet processing step or on-press, and that no gumming step in a separate processing unit is necessary to apply a hydrophilic layer to protect the non-printing areas.

Curing as used herein encompasses a polymerization and/or crosslinking reaction initiated by actinic radiation, preferably UV radiation, but also the solidification of a hot melt ink which is a liquid at jetting temperature but solidifies on the support.

Method of Preparing a Lithographic Printing Plate

A method according to the present invention for preparing a lithographic printing plate comprising a lithographic image consisting of printing areas and non-printing areas comprises the steps of:

- jetting and curing droplets of a first curable fluid on a hydrophilic support thereby forming a printing area of the lithographic image;
- jetting and curing droplets of a second curable fluid in a non-printing area of the lithographic image thereby forming a hydrophilic protective layer on the hydrophilic support.

The first curable fluid may be jetted before, after, or simultaneous with jetting the second curable fluid.

In a preferred embodiment, the sequence of jetting the first and second curable fluid is dependent on the image content of the lithographic image. For example, to generate so-called shadow areas that stay open even at theoretical dot coverages of more than 90%, it may be advantageous to first deposit droplets of the second curable fluid and then the droplets of the first curable fluid. The jetted and preferably at least partially cured droplets of the second curable fluid may inhibit coalescence of the jetted droplets of the first curable fluid. In the so-called highlights on other hand, it may be advantageous to jet the first curable fluid before the second curable fluid.

Curing of the jetted first curable fluid may be performed before jetting the second curable fluid, or the jetted droplets of the first and second curable fluid are cured in a single step.

In another object of the invention the second curable fluid is also jetted and cured on a printing area formed with the first curable fluid to make the printing area less sensitive to for example fingerprints.

Curable Fluids

Both the first and the second curable fluids are substantially water-free, which means that water content is lower than 40 wt %, preferably lower than 20 wt %, more preferably less than 10 wt %, most preferably less than 5 wt %, relative to the total weight of the curable fluid. Due to the low concentration or even absence of water, a drying step in the platemaking process is no longer necessary.

For having a good jettability, the viscosity of both curable fluids at the jetting temperature is preferably smaller than 30 mPa·s, more preferably smaller than 15 mPa·s, and most preferably between 4 and 13 mPa·s at a shear rate of 90 s$^{-1}$ and a jetting temperature between 10 and 70° C.

The viscosity of both curable fluids is preferably smaller than 35 mPa·s, preferably smaller than 28 mPa·s, and most preferably between 2 and 25 mPa·s at 25° C. and at a shear rate of 90 s$^{-1}$.

When using so-called throughflow printheads, the viscosity of the curable fluids may be higher, preferably below 60 mPa·s at 25° C. and at a shear rate of 90 s$^{-1}$. A higher viscosity limit for the curable fluids opens up more compositional variations of the fluid making throughflow printheads very suitable for the inkjet computer-to-plate method according to the present invention.

First Curable Fluid

Any curable fluid with which a hydrophobic printing area can be formed may be used in the method of the present invention. The ink is preferably a non-aqueous UV curable ink. Examples of such UV curable inks are disclosed in EP-A 1637322, EP-A 2199082 and EP-A 253765.

Commercially available inks that may be used are for example the Anapurna®, Anuvia®, Agoria® and Agorix® UV curable inks, all from Agfa Graphics NV.

The first curable fluid may also be a so-called hot melt ink. Such an ink is a liquid at jetting temperature and becomes solid on the lithographic support. An example of such an ink is disclosed in EP-A 1266750. In EP-A 2223803 a UV curable hot melt ink is disclosed that gels upon deposition on a support followed by a UV curing step.

As the printing areas of printing plates are typically coloured (to make the printing areas visible), the first curable fluid preferably comprises a colorant.

The colorants used may be dyes, pigments or a combination thereof.

An advantage of using a dye may be an improved stability of the ink, i.e. no sedimentation of the pigment. Suitable dyes are for example disclosed in WO2005/111727 page 24, lines 11-32. Preferred dyes are blue colored dyes, including cyan dyes.

Pigments are preferably used in the present invention due to an improved stability of the colour, for example towards the UV radiation used for curing the first and second curable fluids. Organic and/or inorganic pigments may be used. Suitable pigments are for example disclosed in WO2005/111727 page 21, line 16 to page 24, line 10 and in paragraphs [0128] to [0138] of WO2008/074548. Preferred pigments are blue colored pigments, including cyan pigments.

The difference in optical density in the printing areas and the non-printing area, i.e. the contrast, has preferably a value of at least 0.3, more preferably at least 0.4, most preferably at least 0.5. There is no specific upper limit for the contrast value, but typically the contrast is not higher than 3.0 or even not higher than 2.0. In order to obtain a good visual contrast for a human observer the type of color of the colorant may also be important. The optical density can be measured in reflectance using an optical densitometer, equipped with several filters (e.g. cyan, magenta, yellow).

In another preferred embodiment the hue of the printing areas corresponds with the hue of the printing ink to be used with the printing plate. For example for a CMYK printing process, the printing plate having the lithographic image for printing with the cyan printing ink has a cyan hue, the printing plate having the lithographic image for printing with the magenta printing ink has a magenta hue, the printing plate having the lithographic image for printing with the yellow printing ink has a yellow hue, and the printing plate having the lithographic image for printing with the black printing ink has a dark hue. The advantage of this method is that errors in mounting a printing plate on the wrong printing unit are eliminated and that no extra markings on the printing plate are required for identifying the colour selection with which the printing plate corresponds.

Second Curable Fluid

The protective layer obtained by applying and curing the second curable fluid has to be sufficiently hydrophilic to avoid toning in the non-printing areas during printing.

A well known technique to evaluate the hydrophilic nature of the protective layer is measuring the contact angle of droplets of demineralized water and/or fountain solution applied on the protective layer. The Static Contact Angle (SCA) of 3 μl droplets of demineralized water or pressready fountain solution measured 1 minute after deposition on a cured coating (wet coating thickness=10 μm) of a second curable fluid is preferably below 15°, more preferably below 10°, most preferably below 5° C.

The protective layer is preferably removed by the ink and/or fountain solution during printing on a printing press. The protective layer is more preferably removed immediately after startup of the press, i.e. after less than 25 prints, preferably after less than 10 prints.

A particularly preferred protective layer is soluble or swellable in the fountain solution used during printing.

The second curable fluid preferably contains at least 75 wt % of one or more monofunctional hydrophilic monomers, more preferable at least 85 wt %, most preferably at least 90 wt %, relative to the total weight of the curable fluid. A hydrophilic monomer is defined as a monomer having a demineralized water solubility at least 5% by weight at 25° C. at pH=7, more preferably a water solubility of at least 10% by weight at 25° C. at pH=7 and most preferably a water solubility of at least 20% by weight at 25° C. at pH=7.

The monofunctional hydrophilic monomers preferably comprise an ethylenically unsaturated polymerisable group selected from the group consisting of an acrylate, a methacrylate, an acrylamide, a methacrylamide, a styrene, a maleimide, an itaconate, a vinyl ester, a vinyl ether, an allyl ether and an allyl ester. The monofunctional hydrophilic monomers more preferably comprise an ethylenically unsaturated polymerisable group selected from the group consisting of an acrylate, a methacrylate, an acrylamide and a methacrylamide. Particularly preferred monofunctional monomers comprise an acrylate or an acrylamide as an ethylenically unsaturated polymerisable group.

The monofunctional hydrophilic monomers can be non-ionic, anionic, cationic or zwitterionic, non-ionic and anionic being more preferred, non-ionic being particularly preferred.

The monofunctional hydrophilic monomers preferably comprise a hydrophilic functional group selected from the group consisting of a sulfonic acid or a salt thereof, a carboxylic acid or a salt thereof, a mono- or diester of phosphoric acid or a salt thereof, a phosphonic acid or a salt thereof, an ammonium group, a sulfonium group, a phosphonium group, a polyethylene glycol, a cyclic amide and a hydroxyl group. In a more preferred embodiment, said hydrophilic functional group is selected from the group consisting of a hydroxyl group and a polyethylene glycol. In a particularly preferred embodiment, the hydrophilic monomer comprises at least two hydroxyl groups.

The monofunctional hydrophilic monomers preferably do not exhibit a strong adhesion on the surface of the lithographic support to ensure a substantially complete removal of the protective layer. For this reason, the amount of monofunctional hydrophilic monomers comprising a functional group that promotes the adhesion of the monomer on the surface of the lithographic support, for example a carboxylic acid or a salt thereof, a phosphonate, or a sulphonate, is preferably less than 50 wt %, more preferably less than 25 wt %, most preferably less than 10 wt % relative to the total amount of monofunctional hydrophilic monomers.

The monofunctional hydrophilic monomers preferably do not interact with the lithographic support making that support less hydrophilic after removal of the protective layer during printing as this may result in unwanted toning during printing. For example alkaline monomers may render the aluminium support more hydrophobic especially when the contact time is rather long, i.e. when there is a long time between providing the hydrophilic layer and starting the print job.

Specific examples of hydrophilic monomers according to the present invention are given below, without being limited thereto.

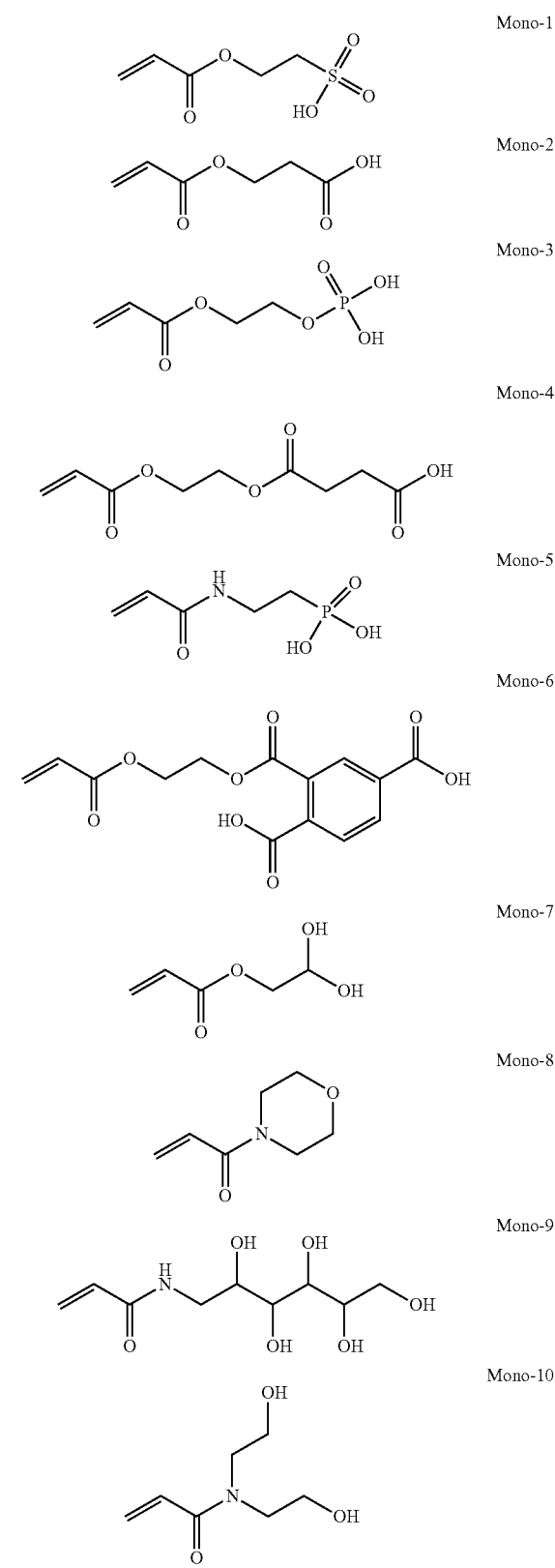

Mono-11

Mono-12

Mono-13

Mono-14

Mono-15

Mono-16

Mono-17

Mono-18

Mono-19

Mono-20

Mono-21

Mono-22

The hydrophilic monomers described above may be used in combination with other monomers, as long as the protective layer obtained is hydrophilic and preferably removed by the ink and/or fountain during printing on a printing press.

The second curable fluid may also comprise other ingredients such as an initiator, a co-initiator, a surfactant, a biocide, etc. In principle conventional initiators, a co-initiators, surfactants, biocides, a diluent, etc. may be used, as long as the protective layer obtained is hydrophilic and preferably soluble in the fountain solution used during printing.

The second curable fluid preferably comprises an initiator. A sufficient amount high amount of initiator will limit the final Molecular Weight (Mw) of the obtained hydrophilic polymers after curing, and as such will enhance the solubility of the polymers in the fountain solution. On the other hand, if the Mw of the polymers is too low they will be sticky, waxy or liquid, which is preferably avoided. The amount of the initiator is preferably between 0.10 and 10 wt %, more preferably between 0.25 and 7.5 wt %, most preferably between 0.50 and 5 wt % relative to the total weight of the curable fluid.

Preferably a photo-initiator is used which upon absorption of actinic radiation, preferably UV-radiation, forms high-energy species (for example radicals) inducing polymerization and optionally crosslinking of the monomers of the jetted droplets of the curable fluid.

A combination of two or more photo-initiators may be used. A photo-initiator system, comprising a photo-initiator and a co-initiator, may also be used. A suitable photo-initiator system comprises a photo-initiator, which upon absorption of actinic radiation forms free radicals by hydrogen abstraction or electron extraction from a second compound, the co-initiator. The co-initiator becomes the actual initiating free radical.

The diluent is preferably a hydrophilic compound with low viscosity, for example below 20 cP, compatible with the other ingredients of the curable fluid. Examples of preferred diluents are ethylene glycol, propylene glycol, water.

The second curable fluid preferably does not contain a dye or a pigment.

Support

The support of the lithographic printing plate precursor has a hydrophilic surface or is provided with a hydrophilic layer.

In a preferred embodiment of the invention the support is a grained and anodized aluminium support.

By graining (or roughening) the aluminium support, both the adhesion of the printing areas and the wetting characteristics of the non-printing areas are improved. By varying the type and/or concentration of the electrolyte and the applied voltage used in the graining step, different type of grains can be obtained. The surface roughness is often expressed as arithmetical mean center-line roughness Ra (ISO 4287/1 or DIN 4762) and may vary between 0.05 and 1.5 µm. The aluminium substrate of the current invention has preferably an Ra value between 0.30 and 0.60 µm, more preferably between 0.35 and 0.55 µm and most preferably between 0.40 and 0.50 µm. The lower limit of the Ra value is preferably 0.1 µm. More details concerning the preferred Ra values of the surface of the grained and anodized aluminium support are described in EP-A 1356926.

By anodizing the aluminium support, its abrasion resistance and hydrophilic nature are improved. The microstructure as well as the thickness of the $Al_2O_3$ layer is determined by the anodizing step. The anodic weight (g/m² $Al_2O_3$ formed on the aluminium surface) varies between 1.0 and 8.0 g/m². The anodic weight is preferably between 1.5 g/m² and 5.0 g/m², more preferably between 2.5 g/m² and 4.0 g/m² and most preferably between 2.5 g/m² and 3.5 g/m².

The grained and anodized aluminium support may be subjected to a so-called post-anodic treatment to further improve the hydrophilic character of its surface. For example, the aluminium support may be silicated by treating its surface with a solution including one or more alkali metal silicate compound(s)—such as for example a solution including an alkali metal phosphosilicate, orthosilicate, metasilicate, hydrosilicate, polysilicate or pyrosilicate—at elevated temperatures, for example at 95° C. Alternatively, a phosphate treatment may be applied which involves treating the aluminium oxide surface with a phosphate solution that may further contain an inorganic fluoride. Further, the aluminium oxide surface may be rinsed with a citric acid or citrate solution, gluconic acid, or tartaric acid. This treatment may be carried out at room temperature or may be carried out at a slightly elevated temperature of about 30 to 50° C. A further interesting treatment involves rinsing the aluminium oxide surface with a bicarbonate solution. Still further, the aluminium oxide surface may be treated with polyvinylphosphonic acid, polyvinylmethylphosphonic acid, phosphoric acid esters of polyvinyl alcohol, polyvinylsulphonic acid, polyvinylbenzenesulphonic acid, sulphuric acid esters of polyvinyl alcohol, acetals of polyvinyl alcohols formed by reaction with a sulphonated aliphatic aldehyde, polyacrylic acid or derivates such as GLASCOL E15™ commercially available from Ciba Specialty Chemicals. One or more of these post treatments may be carried out alone or in combination. More detailed descriptions of these treatments are given in GB-A 1084070, DE-A 4423140, DE-A 4417907, EP-A 659909, EP-A 537633, DE-A 4001466, EP-A 292801, EP-A 291760 and U.S. Pat. No. 4,458,005.

In a preferred embodiment, the support is first treated with an aqueous solution including one or more silicate compound(s) as described above followed by a treatment of the support with an aqueous solution including a compound having a carboxylic acid group and/or a phosphonic acid group, or their salts. Particularly preferred silicate compounds are sodium or potassium orthosilicate and sodium or potassium metasilicate. Suitable examples of a compound with a carboxylic acid group and/or a phosphonic acid group and/or an ester or a salt thereof are polymers such as polyvinylphosphonic acid, polyvinylmethylphosphonic acid, phosphoric acid esters of polyvinyl alcohol, polyacrylic acid, polymethacrylic acid and a copolymer of acrylic acid and vinylphosphonic acid. A solution comprising polyvinylphosphonic acid or poly(meth)acrylic acid is highly preferred.

The support can also be a flexible support, which may be provided with a hydrophilic layer. The flexible support is e.g. paper, plastic film or aluminium. Preferred examples of plastic film are polyethylene terephthalate film, polyethylene naphthalate film, cellulose acetate film, polystyrene film, polycarbonate film, etc. The plastic film support may be opaque or transparent.

The hydrophilic layer is preferably a cross-linked hydrophilic layer obtained from a hydrophilic binder cross-linked with a hardening agent such as formaldehyde, glyoxal, polyisocyanate or a hydrolyzed tetra-alkylorthosilicate. The latter is particularly preferred. The thickness of the hydrophilic layer may vary in the range of 0.2 to 25 µm and is preferably 1.0 to 10 µm. More details of preferred embodiments of the base layer can be found in e.g. EP-A 1 025 992.

The hydrophilic surface of the support is preferably provided with a surfactant to improve the resolution of the printing plate obtained by the method of the present invention. A higher resolution may be obtained when the spreading of the droplets of the first curable fluid on the hydrophilic surface is minimized. Preferred surfactants are fluorosurfactants, for example the Zonyl® surfactants from Dupont. Also preferred are the more environmentally friendly Tivida® fluorosurfactants from Merck.

The amount of fluorosurfactants on the support surface is preferably between 0.005 and 0.5 g/m², more preferably between 0.01 and 0.1 g/m², most preferably between 0.02 and 0.06 g/m².

A particular preferred lithographic support is a grained and anodized aluminium support as described above, treated with an aqueous solution including one or more silicate compound(s), and of which the surface is provided with a fluorosurfactant.

Inkjet Computer-to-Plate Printing Devices

Figure 2:
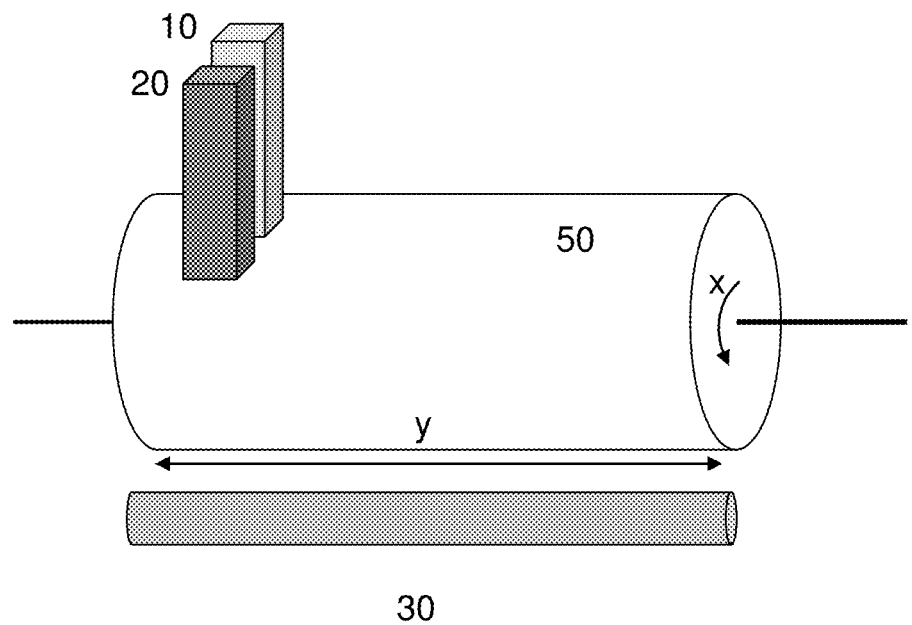
FIG. 2 shows a preferred embodiment of a drum based printing device which is used in a method of preparing a lithographic printing plate according to the present invention.

Various preferred embodiments of an apparatus for creating the lithographic printing plate by inkjet printing may be used. A flat bed printing device or a drum based printing device may be used. A preferred embodiment of a flat bed printing device is shown in FIG. 1 while a preferred embodiment of a drum based printing device is shown in FIG. 2.

In a flat bed printing device (FIG. 1) a lithographic support is provided on a flat bed (40). Droplets of a first and a second curable fluid are jetted from respectively a first (10) and a second (20) print head on the hydrophilic support.

The print heads typically scan back and forth in a transversal direction (x-direction) across a moving lithographic support (y-direction). Such bi-directional printing is referred to as multi-pass printing.

Another preferred printing method is the so-called single-pass printing method wherein the print heads, or multiple staggered print heads, cover the entire width of the lithographic support. In such a single-pass printing method, the print heads usually remain stationary while the support is transported under the print heads (y-direction).

In a drum based printing device (FIG. 2) a lithographic support is mounted on a cylindrical drum (50). While the lithographic support rotates in the x-direction, the print heads jetting a first curable fluid (10) and a second curable fluid (20) are moving in the y-direction.

To obtain maximal dot placement accuracy, the print heads are positioned as close as possible to the surface of the lithographic support. The distance between the print heads and the surface of the lithographic support is preferably less than 3 mm, more preferably less than 2 mm, most preferably less than 1 mm.

The thickness of a lithographic support is typically between 0.1 and 0.5 mm with a tolerance on the thickness of ±0.015 mm. As the distance between the printhead and the surface of the lithographic support may influence the dot placement accuracy, it may be advantageous to measure the thickness of a lithographic support and adapting the distance between the printhead and the surface of the lithographic support based on the measurement of the thickness of the lithographic support.

The distance between a stationary printhead and the surface of a lithographic support mounted on the printing device may also vary over the whole lithographic support, due to for example waviness of the support, or other irregularities in the surface of the support. Therefore it may also be advantageous to measure the surface topography of the lithographic support and to compensate the differences in the measured surface topography by controlling the so-called firing time of the droplets of curable fluids on the lithographic support, or by adjusting the distance between the printhead and the surface of the support. Examples of measurement devices to measure the surface topography of a lithographic supports is disclosed in ISO 12635:2008(E).

In a preferred embodiment the inkjet computer-to-plate printing device has holding down means, such as a vacuum chamber under the printing support, to hold down the lithographic support in a so-called hold-down zone, for example by vacuum. In a more preferred embodiment the lithographic support is hold down against the printing support by independent working holding down means such as a plurality of vacuum chambers under the printing support which are independently controlled to enhance the vacuum pressure on the printing support so that more than one hold down zones are generated on the printing support. The holding down of the lithographic support enhances the drop placement of the jetted droplets and position accuracy of the lithographic image which gives a better alignment and colour-on-colour registration when printing the colour digital image with the prepared lithographic printing plates on an offset press.

In a CMYK printing process, typically four lithographic printing plates are used, each plate containing the lithographic image for printing with respectively the cyan, the magenta, the yellow and the black printing ink. In such a CMYK printing process the colour-on-colour registration is very important to obtain optimal results. Accurate positioning of the lithographic support in the printing device is for this reason very important. Those positioning means that are used in conventional CtP platesetters, for example the three-point registration system, may be used in the inkjet devices.

Print Head

Both the first and the second curable fluid may be jetted by one or more print heads ejecting small droplets in a controlled manner through nozzles onto the lithographic support, which is moving relative to the print head(s).

A preferred print head for the inkjet printing system is a piezoelectric head. Piezoelectric inkjet printing is based on the movement of a piezoelectric ceramic transducer when a voltage is applied thereto. The application of a voltage changes the shape of the piezoelectric ceramic transducer in the print head creating a void, which is then filled with ink. When the voltage is again removed, the ceramic expands to its original shape, ejecting a drop of ink from the print head. However the inkjet printing method according to the present invention is not restricted to piezoelectric inkjet printing. Other inkjet print heads can be used and include various types, such as the continuous printing type.

To obtain a sufficient resolution on the printing plate, for example 1200 or 1800 dpi, preferred print heads eject droplets having a volume≤15 pl, more preferably ≤10 pl, most preferably ≤5 pl, particularly preferred ≤3 pl.

Another preferred print head is a multi-drop piezoelectric inkjet print head. A multi-drop piezoelectric print head, also called a grayscale piezoelectric print head, such as the Konica Minolta™ KM1024i, is capable of jetting droplets in a plurality of volumes, to improve the quality of the lithographic images on the lithographic supports.

Another preferred print head is a throughflow piezoelectric inkjet print head. A throughflow piezoelectric inkjet print head is a print head wherein a continuous flow of liquid is circulating through the liquid channels of the print head to avoid agglomerations in the liquid which may cause disturbing effects in the flow and bad drop placements. Avoiding bad drop placements by using throughflow piezoelectric inkjet print heads may improve the quality of the lithographic images on the lithographic supports. Another advantage of using such throughflow print heads is a higher viscosity limit of the curable fluids to be jetted, widening the scope of compositional variations of the fluids.

Two different print heads may be used for the first and the second curable fluid. For example, the droplets of the second curable fluid may be larger than those of the first curable fluid. For the second curable fluid, the droplets may even be higher than 15 pl.

Curing Devices

The first and the second curable fluids are preferably cured by exposure to actinic radiation, preferably to ultraviolet radiation.

The curing means may be arranged in combination with the print heads of the printing device, travelling therewith so that the curing radiation is applied very shortly after jetting. Such rapid curing is sometimes referred to as "pin curing" and used for enhancing image quality by controlling the dot size. Preferably such curing means consists of one or more UV LEDs. In such an arrangement, it can be difficult to provide other types of curing means that are small enough to be connected to and travelling with the printhead. Therefore, a static fixed radiation source may be employed, e.g. a UV bulb, connected to the printhead by means of flexible radiation conductive means such as a fibre optic bundle or an internally reflective flexible tube. Alternatively, the actinic radiation may be supplied from a fixed source to the radiation head by an arrangement of mirrors including a mirror on the printhead.

The source of radiation may also be an elongated radiation source extending transversely across the substrate to be cured (curing means 30 in FIGS. 1 and 2). It may be adjacent the transverse path of the print head so that the subsequent rows of images formed by the print head are passed, stepwise or continually, beneath that radiation source.

Both curing means, i.e. a curing means travelling with the print heads and an elongated radiation source may be combined.

Any ultraviolet light source, as long as part of the emitted light can be absorbed by the photo-initiator or photo-initiator system, may be employed as a radiation source, such as a high or low pressure mercury lamp, a cold cathode tube, a black light, an ultraviolet LED, an ultraviolet laser, and a flash light. Of these, the preferred source is one exhibiting a relatively long wavelength UV-contribution having a dominant wavelength of 300-400 nm. Specifically, a UV-A light source is preferred due to the reduced light scattering therewith resulting in more efficient interior curing.

UV radiation is generally classed as UV-A, UV-B, and UV-C as follows:

UV-A: 400 nm to 320 nm
UV-B: 320 nm to 290 nm
UV-C: 290 nm to 100 nm

In a preferred embodiment, the inkjet printing device contains one or more UV LEDs with a wavelength larger than 360 nm, preferably one or more UV LEDs with a wavelength larger than 380 nm, and most preferably UV LEDs with a wavelength of about 395 nm.

Furthermore, it is possible to cure the image using, consecutively or simultaneously, two light sources of differing wavelength or illuminance. For example, the first UV-source can be selected to be rich in UV-C, in particular in the range of 260 nm-200 nm. The second UV-source can then be rich in UV-A, e.g. a gallium-doped lamp, or a different lamp high in both UV-A and UV-B. The use of two UV-sources has been found to have advantages e.g. enabling a fast curing speed and a high curing degree.

For facilitating curing, the printing device often includes one or more oxygen depletion units. The oxygen depletion units place a blanket of nitrogen or other relatively inert gas (e.g. $CO_2$), with adjustable position and adjustable inert gas concentration, in order to reduce the oxygen concentration in the curing environment. Residual oxygen levels are usually maintained as low as 200 ppm, but are generally in the range of 200 ppm to 1200 ppm.

Curing can be "partial" or "full". The terms "partial curing" and "full curing" refer to the degree of curing, i.e. the percentage of converted functional groups, and may be determined by, for example, RT-FTIR (Real-Time Fourier Transform Infra-Red Spectroscopy) which is a method well known to the one skilled in the art of curable formulations. Partial curing is defined as a degree of curing wherein at least 5%, preferably 10%, of the functional groups in the coated formulation or the fluid droplet is converted. Full curing is defined as a degree of curing wherein the increase in the percentage of converted functional groups with increased exposure to radiation (time and/or dose) is negligible. Full curing corresponds with a conversion percentage that is within 10%, preferably 5%, from the maximum conversion percentage. The maximum conversion percentage is typically determined by the horizontal asymptote in a graph representing the percentage conversion versus curing energy or curing time.

Because the hydrophilic protective layer formed by a cured second curable fluid is preferably removed by or soluble in the fountain used during printing, it may be advantageous to partially cure the jetted droplets of the second curable fluid.

EXAMPLES

Materials

All materials used in the following examples were readily available from standard sources such as ALDRICH CHEMICAL Co. (Belgium) and ACROS (Belgium) unless otherwise specified. The water used was deionized water.

ACMO is N-acryloylmorpholine from Rahn AG.
HEA is 2-hydroxyethylacrylate from BASF.
MAES is mono-2-acryloxy-ethyl succinate from Aldrich.
PEA is polyethyleneoxide monoacrylate from Cognis.
TPO-L is trimethylbenzoylethoxyphenylphosphine from BASF
HBA is 4-hydroxybutylacrylate from Nippon Kasei Chemical Co.
MA is methacrylic acid from Akros Chimica.
BYK333 is a surfactant from BYK Additives&Instruments
Zonyl FSA is a fluorosurfactant from Dupont.

Measurement Methods
Viscosity
A Brookfield DV-II+Pro Viscometer, controlled with Brookfield's Rheocalc32 Version 2.6 Software, was used to measure the dynamic viscosity of each gum sample. Rheocalc was programmed with the following settings:

| Command | Meaning | Value |
|---|---|---|
| WTI | Wait for time interval (dictates waiting time before first reading) | 60 seconds |
| SSN | Rotation speed of viscometer | 12 rpm |
| LSC | Loop count (number of readings) | 3 |
| WTI | Wait for time interval (rotation time before a reading is taken) | 30 seconds |

The program was designed for viscosities between 6-12 mPa·s, the optimal range for jettability in a piezoelectric inkjet printing head. In cases where the viscosity was lower than 6 mPa·s, SSN was increased. SSN was lowered if the viscosity was higher than 12 mPa·s. Viscosity measurements were performed at a temperature of 45° C., to emulate the average temperature of a print head.

Preparation of the Lithographic Support

A 0.3 mm thick aluminium foil was degreased by spraying its surface with an aqueous solution containing 34 g/l NaOH at 70° C. for 6 seconds followed by rinsing it with demineralised water for 3.6 seconds. The foil was then electrochemically grained during 8 seconds using an alternating current in an aqueous solution containing 15 g/l HCl, 15 g/l $SO_4^{2-}$ ions and 5 g/l $Al^{3+}$ ions at a temperature of 37° C. and a current density of about 100 $A/dm^2$ (charge density of about 800 $C/dm^2$). Afterwards, the aluminium foil was desmutted by etching with an aqueous solution containing 6.5 g/l of sodium hydroxide at 35° C. for 5 seconds and rinsed with demineralised water for 4 seconds. The foil was subsequently subjected to anodic oxidation during 10 seconds in an aqueous solution containing 145 g/l of sulfuric acid at a temperature of 57° C. and an anodic charge of 250 $C/dm^2$, then washed with demineralised water for 7 seconds and dried at 120° C. for 7 seconds.

The grained and anodized aluminium support thus obtained was characterised by a surface roughness $R_a$ of 0.45-0.50 μm (measured with interferometer NT3300 and had an anodic weight of about 3.0 $g/m^2$ (gravimetric analysis).

The above described support was then silicated by spraying a sodium silicate solution (25 g/l sodium silicate in water) onto it for 4 seconds at 70° C., followed by a rinsing step with demineralised water for 3.5 seconds and a drying step at 120° C. for 7 seconds.

Subsequently, the silicated support was coated with a fluorosurfactant solution (4 g/l Zonyl FSA and 4 g/l potassium nitrate in demineralised water) at a wet coating thickness of 10 μm. The substrate was dried for 5 seconds at 120° C.

Preparation of the Second Curable Fluids FL-01 to FL-06

The second curable fluids FL-01 to FL-06 were prepared by mixing the ingredients of Table 1 for at least one hour at room temperature in darkly coloured sample bottles.

TABLE 1

| wt % | FL-01 | FL-02 | FL-03 | FL-04 | FL-05 | FL-06 |
|---|---|---|---|---|---|---|
| HBA | 49.5 | — | — | — | — | — |
| PEA | 49.5 | — | 46.5 | 98.0 | 49.5 | 49.5 |
| HEA | — | 49.0 | — | — | 49.5 | — |
| MAES | — | 49.0 | 46.5 | — | — | — |
| MA | — | — | 5.0 | — | — | — |
| ACMO | — | — | — | — | — | 49.5 |
| TPO-L | 1.0 | 2.0 | 2.0 | 2.0 | 1.0 | 1.0 |

Preparation of a Cured Hydrophilic Layers HL-01 to HL-06

The curable fluids FL-01 to FL-06 were coated on a unsubbed 100 μm polyethyleneterephthalate (PET) sheet and on the lithographic support described above at a wet coating thickness of 10 μm using a laboratory coating machine. Both were then inserted into a quartz box under nitrogen atmosphere. The box was then exposed to UV-A radiation for seven seconds with the use of eight Philips ACTINIC BL 20 W UV-A light bulbs. In the span of seven seconds, each lamp emits approximately 0.006 W/cm$^2$. The samples were then taken out of the box and run over with a cotton swab to ensure the coatings were fully cured, i.e. substantially no material was removed by the cotton swab.

Hydrophilicity of the Cured Hydrophilic Layer HL-01 to HL-06

These measurements were carried out on the cured hydrophilic layer provided on the PET support. Surface contact measurements were performed in order to evaluate the hydrophilicity of the cured layers. Droplets of 3 μl demineralized water and pressready fountain solution (4 wt % in demineralized water Prima FS404 from Agfa Graphics) were applied to each UV-cured coating with a Kruss DSA100 (Drop shape analyser). The droplets remained on the coating for approximately one minute to study the droplet spread. The hydrophilicity of the cured layer was considered OK when the Static Contact Angle (SCA) of the applied droplets was below 10°.

After one minute the droplets were wiped off with a cotton pas to see how much of the gum would come off with the droplets.

Printing

A print test was conducted with the cured hydrophilic layers HL-01 to HL-06 coated on the lithographic support to evaluate their hydrophilicity and solubility on a printing press. Furthermore it is important to evaluate if the UV-cured hydrophilic layer has an adverse effects on the printing process such as increased start-up, stickiness of the paper, etc. . . . . . Up to 250 prints were done with a Heidelberg GTO 52 sheetfed press (using K+E 800 ink from Flint; 2 wt % FS 404 fountain from Agfa Graphics; and 90 g paper from Amber Offset).

Results

The results are given in Table 2.

TABLE 2

| | Viscosity (mPa · s) | Hydrophilicity | Solubility in water/fountain | Printing Test |
|---|---|---|---|---|
| CL-01 | 9.99 | OK | yes | + |
| CL-02 | 10.09 | NOK | no | − |
| CL-03 | 44.24 | NOK | moderate | − |
| CL-04 | 22.09 | OK | yes | ++ |
| CL-05 | 8.02 | OK | yes | + |
| CL-06 | 11.88 | OK | yes | + |

From the results in Table 2 it is clear that with cured protective layers having a good hydrophilicity (the contact angle of 3 μl droplets of water or fountain solution measured 1 minute after deposition on the cured coatings below) 10° and a sufficient solubility in water and fountain, a good printing performance was observed (no toning, good start-up, etc.).

The invention claimed is:

1. A method for preparing a lithographic printing plate comprising the steps of:
    jetting and curing droplets of a first curable fluid on a hydrophilic support to form a printing area of a lithographic image; and
    jetting and curing droplets of a second curable fluid in a non-printing area of the lithographic image to form a hydrophilic protective layer on the hydrophilic support.

2. The method according to claim 1, wherein a sequence of jetting and curing the first curable fluid and the second curable fluid is dependent on an image content of the lithographic image.

3. The method according to claim 1, wherein the jetted droplets of the first curable fluid and the second curable fluid are cured in a single step.

4. The method according to claim 1, wherein the curing of each of the first curable fluid and the second curable fluid is carried out by exposure to ultraviolet radiation.

5. The method according to claim 1, wherein a Static Contact Angle (SCA) of 3 μl droplets of water or pressready fountain solution measured 1 minute after deposition on the hydrophilic protective layer is below 10°.

6. The method according to claim 1, further comprising the steps of:
    mounting the lithographic printing plate including the lithographic image and the hydrophilic protective layer on a printing press; and
    supplying ink and fountain solution to the lithographic printing plate and transferring the ink to paper; wherein the hydrophilic protective layer is substantially completely removed by the fountain solution and/or the ink.

7. The method according to claim 1, wherein the second curable fluid includes at least 75 wt % of a monofunctional hydrophilic monomer, relative to a total weight of the second curable fluid.

8. The method according to claim 7, wherein the monofunctional hydrophilic monomer includes an ethylenically unsaturated polymerizable group selected from the group consisting of an acrylate, a methacrylate, an acrylamide, a methacrylamide, a styrene, a maleimide, an itaconate, a vinyl ester, a vinyl ether, an allyl ether, and an allyl ester.

9. The method according to claim 7, wherein the monofunctional hydrophilic monomer includes a hydrophilic functional group selected from the group consisting of a sulfonic acid or a salt thereof, a carboxylic acid or a salt thereof, a mono- or diester of phosphoric acid or a salt thereof, a phosphonic acid or a salt thereof, an ammonium group, a sulfonium group, a phosphonium group, a polyethylene glycol, a cyclic amide, and a hydroxyl group.

10. The method according to claim 1, wherein the hydrophilic support is a grained and anodized aluminum support.

11. The method according to claim 10, wherein the grained and anodized aluminum support has been silicated.

12. The method according to claim 1, wherein a surface of the hydrophilic support includes a fluorosurfactant.

13. The method according to claim 1, wherein the curing of the first curable fluid and the second curable fluid includes:
    polymerization and/or a crosslinking reaction of the first curable fluid and/or of the second curable fluid; or
    solidification of the first curable fluid and/or of the second curable fluid in which the first curable fluid and/or of the second curable fluid is a hot melt fluid that is a liquid at a jetting temperature.

* * * * *